(12) United States Patent
Hwang et al.

(10) Patent No.: US 7,718,088 B2
(45) Date of Patent: May 18, 2010

(54) LIGHT EMITTING DIODE AND WAVELENGTH CONVERTING MATERIAL

(75) Inventors: Wen-Jeng Hwang, Yunlin County (TW); Chih-Chin Chang, Hsinchu (TW); Hsiang-Cheng Hsieh, Taoyuan County (TW); Hsin-Hua Ho, Miaoli County (TW)

(73) Assignee: LightHouse Technology Co., Ltd, Hsin-Chu (TW)

( * ) Notice: Subject to any disclaimer, the term of this patent is extended or adjusted under 35 U.S.C. 154(b) by 987 days.

(21) Appl. No.: 11/420,766

(22) Filed: May 29, 2006

(65) Prior Publication Data

US 2007/0262325 A1 Nov. 15, 2007

(30) Foreign Application Priority Data

May 12, 2006 (TW) ............................... 95116888 A

(51) Int. Cl.
*C09K 11/02* (2006.01)
(52) U.S. Cl. .................. 252/301.36; 428/403; 428/404; 428/406; 313/503; 257/98; 252/301.4 R; 252/301.4 F; 252/301.4 S; 252/301.5; 252/301.6 R; 252/301.6 S; 252/301.6 F; 252/301.4 P; 252/301.6 P
(58) Field of Classification Search ............ 252/301.36; 252/301.4 R–301.6 P; 428/403, 404, 406; 313/503; 257/98
See application file for complete search history.

(56) References Cited

U.S. PATENT DOCUMENTS

| | | | | |
|---|---|---|---|---|
| 4,024,298 A | * | 5/1977 | Mossman | ............ 427/64 |
| 5,126,204 A | * | 6/1992 | Tono et al. | ............ 428/403 |
| 6,013,979 A | * | 1/2000 | Picht et al. | ............ 313/467 |
| 6,252,254 B1 | | 6/2001 | Soules et al. | |
| 6,936,862 B1 | | 8/2005 | Chang et al. | |
| 7,511,411 B2 | * | 3/2009 | Maruta et al. | ............ 313/483 |
| 2005/0012076 A1 | | 1/2005 | Morioka | |
| 2005/0073239 A1 | * | 4/2005 | Srivastava et al. | ............ 313/487 |
| 2006/0078734 A1 | * | 4/2006 | Braune et al. | ............ 428/403 |
| 2006/0152139 A1 | * | 7/2006 | Hsieh et al. | ............ 313/503 |
| 2006/0222757 A1 | * | 10/2006 | Loureiro et al. | ............ 427/64 |

FOREIGN PATENT DOCUMENTS

| | | | |
|---|---|---|---|
| DE | 19638667 | | 4/1998 |
| DE | 10247021 | | 4/2004 |
| DE | 102004024889 | | 1/2005 |
| DE | 202005010225 | | 11/2005 |
| DE | 102004063824 | | 12/2005 |
| DE | 102005041260 | | 7/2006 |
| EP | 1560274 | | 8/2005 |
| JP | 2004-107572 | | 8/2004 |
| KR | 10-2003-0097609 | | 12/2003 |
| KR | 10-2005-0111517 | | 11/2005 |
| WO | WO 2004/042834 | * | 5/2004 |
| WO | WO2004074400 | * | 9/2004 |

* cited by examiner

*Primary Examiner*—C. Melissa Koslow
(74) *Attorney, Agent, or Firm*—Jianq Chyun IP Office

(57) ABSTRACT

A wavelength converting material including a wavelength converting activator and a scatter is provided. The wavelength converting activator is suitable for being activated by a light with a wavelength $\lambda_1$, so as to emit a light with a wavelength $\lambda_2$. The scatter is disposed on the wavelength converting activator. The scatter is suitable for scattering a first light and a second light irradiated to a surface thereof. As a result of that the scatters on the wavelength converting activators increases the gap of two wavelength converting activators adjacent to each other, the wavelength converting activators could be sufficiently activated for emitting a light with wavelength $\lambda_2$ while the wavelength converting materials are irradiated by the light with $\lambda_1$. Therefore, the brightness of a light emitting diode with the wavelength converting material is enhanced.

49 Claims, 4 Drawing Sheets

LIGHT EMITTING DIODE AND WAVELENGTH CONVERTING MATERIAL

CROSS-REFERENCE TO RELATED APPLICATION

This application claims the priority benefit of Taiwan application serial no. 95116888, filed on May 12, 2006. All disclosure of the Taiwan application is incorporated herein by reference.

BACKGROUND OF THE INVENTION

1. Field of Invention

The present invention relates to a light emitting device and a wavelength converting material thereof. More particularly, the present invention relates to a light emitting device with high brightness and a wavelength converting material thereof.

2. Description of Related Art

FIG. 1 is a schematic view of a conventional light emitting diode (LED). Referring to FIG. 1, the LED 100 includes a carrier 110, a blue LED chip 120, and a yellow phosphor encapsulant 130. The blue LED chip 120 is disposed on the carrier 110 and electrically connected to the carrier 110 via a bonding wire 140, wherein the blue LED chip 120 is suitable for emitting a blue light.

The yellow phosphor encapsulant 130 is directly overlaid on the blue LED chip 120 and is located in the illumination range of the blue light. The yellow phosphor encapsulant 130 includes a transparent material 132 and yellow phosphors 134, wherein the yellow phosphors 134 are uniformly mixed in the transparent material 132 and is suitable for being activated by the blue light emitted by the blue LED chip 120 so as to emit a yellow light. The LED 100 can be used as a white light source after the blue light and yellow light therein are appropriately mixed.

FIG. 2 is an enlarged schematic view of Region A in FIG. 1. Referring to FIG. 2, the yellow phosphors 134 are uniformly mixed in the transparent material 132, but in fact, an aggregation phenomenon of the yellow phosphors 134 often occurs, as shown by the yellow phosphors 134a-134c. As such, a part of the yellow phosphors (such as 134a) is likely to be shielded by other yellow phosphors (such as 134b and 134c) and cannot be irradiated by the blue light. Therefore, the aggregation phenomenon results in poor wavelength converting efficiency of the yellow phosphors 134.

Additionally, in the conventional art, in order to uniformly mix the blue light and yellow light in the LED 100, a scatter or air bubbles with light insensitivity and preferable reflectivity are doped in the yellow phosphor encapsulant 130 and are uniformly mixed with the yellow phosphors 134. However, this process consumes a part of the quantity of light and decreases the brightness of the LED 100.

SUMMARY OF THE INVENTION

Accordingly, an objective of the present invention is to provide a wavelength converting material with high wavelength converting efficiency.

Another objective of the present invention is to provide an LED with high brightness.

The wavelength converting material provided by the present invention includes a wavelength converting activator and a scatter. The wavelength converting activator is suitable for being activated by a light with a wavelength $\lambda_1$ so as to emit a light with a wavelength $\lambda_2$. The scatter is disposed on the wavelength converting activator. The scatter is suitable for scattering the light irradiated to a surface thereof.

According to the wavelength converting material described in an embodiment of the present invention, the material of the wavelength converting activator is selected from fluorescent material, phosphorous material, dyes, and any combination thereof. The composition of the wavelength converting activator is represented by, for example: $(A)_{2x}(B)_{2y}(C)_{2z}(D)_{3x+sy+tz}$:(E), wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

According to the wavelength converting material described in an embodiment of the present invention, the material of the scatter is selected from, for example, $Al_2O_3$, ZnO, $SiO_2$, $TiO_2$, or the material with the composition of $(A)_{2x'}(B)_{2y'}(C)_{2z'}(D)_{3x'+s'y'+t'z'}$:(E), wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is Ce, Eu, Tb, Mn, and any combination thereof.

According to the wavelength converting material described in an embodiment of the present invention, the scatter is suitable for being activated by the light with the wavelength $\lambda_1$ so as to emit a light with a wavelength $\lambda_3$.

According to the wavelength converting material described in an embodiment of the present invention, the scatter is suitable for being activated by the light with the wavelength $\lambda_2$ so as to emit a light with a wavelength $\lambda_3$.

According to the wavelength converting material described in an embodiment of the present invention, a bonding compound is further included, which is disposed between the wavelength converting activator and the scatter. Furthermore, the bonding compound is suitable for being activated by the light with the wavelength $\lambda_1$ so as to emit a light with a wavelength $\lambda_4$.

According to the wavelength converting material described in an embodiment of the present invention, the wavelength converting activator includes a core and a first transparent coating. The core is suitable for being activated by the light with the wavelength $\lambda_1$ so as to emit the light with the wavelength $\lambda_2$. The core is clad with the first transparent coating. The material of the core is selected from fluorescent material, phosphorous material, dyes, and any combination thereof. The composition of the core is represented by, for example: $(A)_{2x}(B)_{2y}(C)_{2z}(D)_{3x+sy+tz}$: (E) wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Li, Na, K, Ag, and any combination thereof; C is selected from Mo, W, P, V, Si, Ti, Zr, Nb, Ta, and any combination thereof, D is selected from O, S, Se, and any combination thereof; and E is selected from Ce, Eu, Tb, Mn, and any combination thereof.

According to the wavelength converting material described in an embodiment of the present invention, a second transparent coating is further included to clad the wavelength converting activator and the scatter, wherein the material of the second transparent coating is, for example, $SiO_2$.

According to the wavelength converting material described in an embodiment of the present invention, the wavelength converting material further includes a transparent material, wherein the wavelength converting activator and the scatter are distributed in the transparent material.

The LED provided by the present invention includes a carrier, an LED chip, and a wavelength converting material. The LED chip is disposed on the carrier and electrically connected to the carrier, wherein the LED chip is suitable for emitting the light with the wavelength $\lambda_1$. The wavelength converting material is disposed around the LED chip and includes a wavelength converting activator and a scatter. The wavelength converting activator is suitable for being activated by the light with the wavelength $\lambda_1$ so as to emit the light with the wavelength $\lambda_2$. The scatter is disposed on the wavelength converting activator and suitable for scattering the light irradiated to a surface thereof.

According to the LED described in an embodiment of the present invention, the material of the wavelength converting activator is selected from fluorescent material, phosphorous material, dyes, and any combination thereof. The composition of the wavelength converting activator is represented by, for example, $(A)_{2x}(B)_{2y}(C)_{2z}(D)_{3x+sy+tz}:(E)$, wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Ti, In, B, Lu, and any combination thereof; B is selected from Mg, Ca, Sr, Ba, Zn, Cu, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

According to the LED described in an embodiment of the present invention, the material of the scatter is, for example, $Al_2O_3$, $ZnO$, $SiO_2$, $TiO_2$, or the material with the composition of $(A)_{2x'}(B)_{2y'}(C)_{2z'}(D)_{3x'+s'y'+t'z'}:(E)$, wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

According to the LED described in an embodiment of the present invention, the scatter is suitable for being activated by the light with the wavelength $\lambda_1$ so as to emit the light with the wavelength $\lambda_3$.

According to the LED described in an embodiment of the present invention, the scatter is suitable for being activated by the light with the wavelength $\lambda_2$ so as to emit the light with the wavelength $\lambda_3$.

According to the LED described in an embodiment of the present invention, a bonding compound is further included, which is disposed between the wavelength converting activator and the scatter. The bonding compound is suitable for being activated by the light with the wavelength $\lambda_1$ so as to emit the light with the wavelength $\lambda_4$.

According to the LED described in an embodiment of the present invention, the wavelength converting activator includes a core and a first transparent coating. The core is suitable for being activated by the light with the wavelength $\lambda_1$ so as to emit the light with the wavelength $\lambda_2$. The core is clad with the first transparent coating, wherein the material of the first transparent coating is, for example, $SiO_2$. The material of the core is selected from fluorescent material, phosphorous material, dyes, and any combination thereof. The composition of the core is represented by, for example: $(A)_{2x}(B)_{2y}(C)_{2z}(D)_{3x+sy+tz}:(E)$, wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

Furthermore, the light refractive index of the transparent material is approximate to that of the first transparent coating, so as to avoid total reflection and F Fresnel loss at the junction of the first transparent coating and the transparent material when the light is irradiated into the transparent material from the first transparent coating.

According to the LED described in an embodiment of the present invention, a second transparent coating is further included to clad the wavelength converting activator and the scatter, wherein the second transparent coating is, for example, $SiO_2$.

According to the LED described in an embodiment of the present invention, the wavelength converting material further includes a transparent material, wherein the wavelength converting activator and the scatter are distributed in the transparent material.

Since the scatters on the wavelength converting activators increase the gap of two wavelength converting activators adjacent to each other, the light with the wavelength $\lambda_1$, activates the wavelength converting activators through the gap between the wavelength converting activators when the wavelength converting materials are irradiated by the light with the wavelength $\lambda_1$. Therefore, these wavelength converting activators can be sufficiently activated so as to emit the light with the wavelengths $\lambda_2$. As such, the brightness of a light emitting diode with the wavelength converting material is higher.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
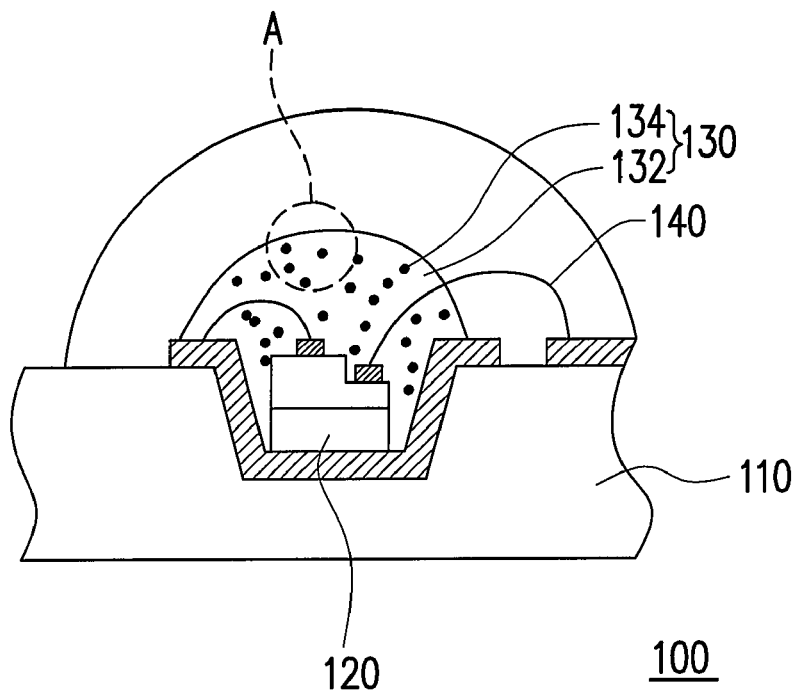
FIG. 1 is a schematic view of the conventional LED.
Figure 2:
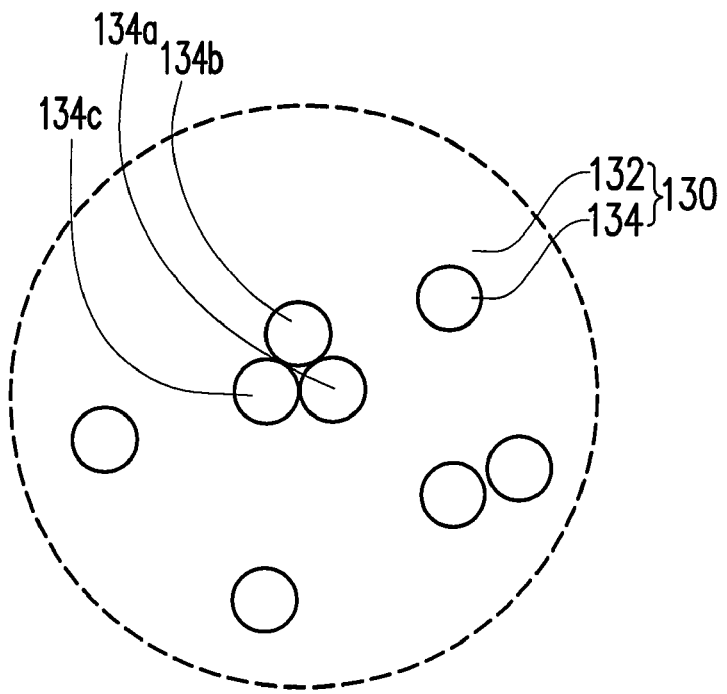
FIG. 2 is an enlarged schematic view of Region A in FIG. 1.
Figure 3:
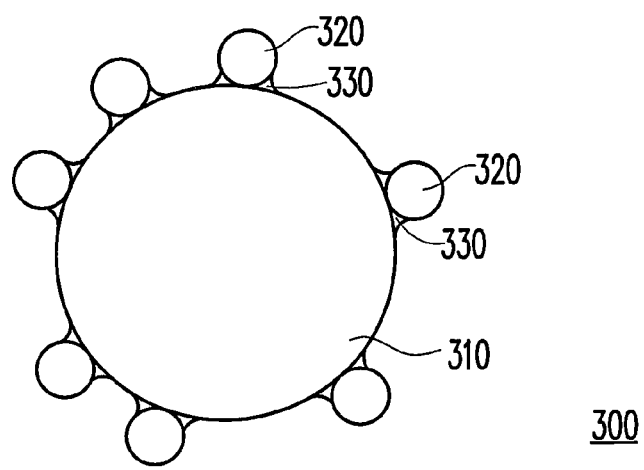
FIG. 3 is a schematic view of the wavelength converting material according to an embodiment of the present invention.

FIG. 3 is a schematic view of the wavelength converting material according to an embodiment of the present invention. Referring to FIG. 3, the wavelength converting material 300 mainly includes a wavelength converting activator 310 and a scatter 320. The wavelength converting activator 310 is suitable for being activated by the light with the wavelength $\lambda_1$ so as to emit the light with the wavelength $\lambda_2$, where $\lambda_1 \neq \lambda_2$. The material of the wavelength converting activator 310 is selected from, for example, fluorescent material, phosphorous material, dyes, and any combination thereof. More particularly, the composition of the wavelength converting activator 310 is represented by, for example, $(A)_{2x}(B)_{2y}(C)_{2z}(D)_{3x+sy+tz}:(E)$, wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Ti, In, B, Lu, and any combination thereof; B is selected from Mg, Ca, Sr, Ba, Zn, Cu, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

The material of the scatter 320 is selected from, for example, $Al_2O_3$, ZnO, $SiO_2$, $TiO_2$, and any material capable of reflecting the light with the specific wavelength. The scatter 320 is physically or chemically bonded with the wavelength converting activator 310 and is disposed on the wavelength converting activator 310. It should be noted that the scatter 320 can be provided with only the function of reflecting a light in a specific wavelength range, or also can be with the functions of reflecting a light in a specific wavelength range and being activated by another light in another specific wavelength range at the same time. The material of such scatters 320 with dual-function is selected from, for example, $Al_2O_3$, ZnO, $SiO_2$, $TiO_2$, or the material with the composition of $(A)_{2x'}(B)_{2y'}(C)_{2z'}(D)_{3x'+s'y'+t'z'}:(E)$, wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof. It should be noted that at least one set of the numeral values from x' and x, y' and y, z' and z, s' and s, and t' and t are different. That is, the component elements of the scatter 320 with dual-function can be the same as those of the wavelength converting activator 310, but the ratios of the compositions of them are different.

The scatter 320 is further activated by the light with the wavelength $\lambda_1$ to emit a light with a wavelength $\lambda_3$ and reflect the light with the wavelength $\lambda_2$. Additionally, in another embodiment, the scatter 320 is also activated by the light with the wavelength $\lambda_2$ to emit a light with the wavelength $\lambda_3$ and reflect the light with the wavelength $\lambda_1$. Definitely, in another embodiment of the present invention, a part of the scatter 320 is suitable for being activated by the light with the wavelength $\lambda_1$ to emit the light with the wavelength $\lambda_3$ and reflect the light with the wavelength $\lambda_2$. The remaining part of the scatter 320 is suitable for being activated by the light with the wavelength $\lambda_2$ to emit the light with the wavelength $\lambda_3$ and reflect the light with the wavelength $\lambda_1$.

When the scatter 320 is chemically bonded with the wavelength converting activator 310, a bonding compound 330 is located between the scatter 320 and the wavelength converting activator 310. The scatter 320 is suitable for scattering the light irradiated to the surface thereof.

Figure 4:
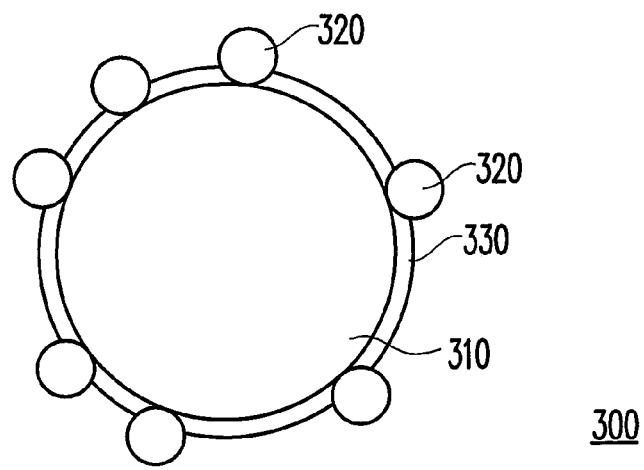
FIG. 4 is a schematic view of the wavelength converting material according to an embodiment of the present invention.

It should be noted that since the amount of the bonding compound 330 generated depends on the conditions of bonding reaction, in addition to exposing a part of the surface of the wavelength converting activator 310 as shown in FIG. 3, the bonding compound 330 can also completely clad the wavelength converting activator as shown in FIG. 4, in which FIG. 4 is a schematic view of the wavelength converting material according to an embodiment of the present invention. Additionally, in the embodiment, the bonding compound 330 is suitable for being activated by the light in a specific wavelength range. For example, the bonding compound 330 can be activated by the light with the wavelength $\lambda_1$ so as to emit the light with the wavelength $\lambda_4$.

Figure 5:
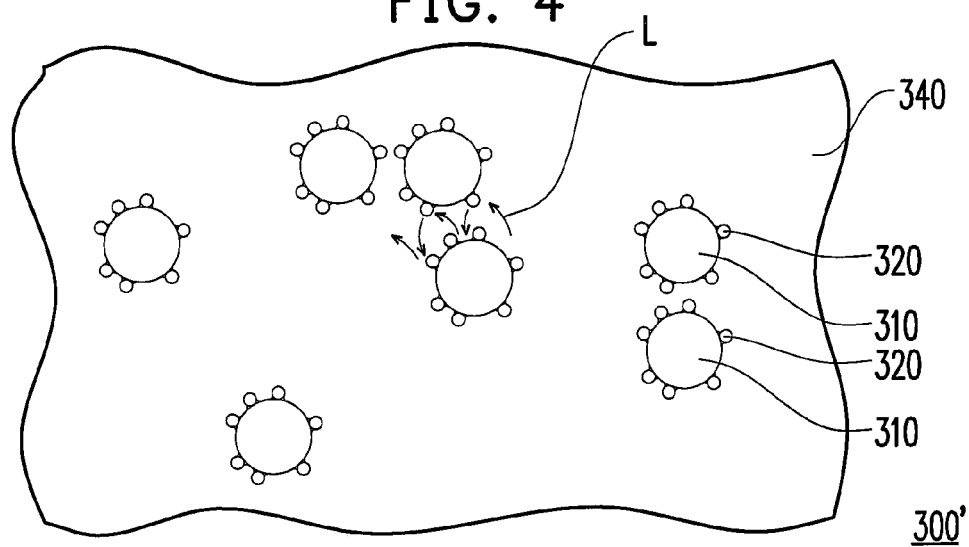
FIG. 5 is a schematic view of the wavelength converting material in the form of material according to an embodiment of the present invention.

Additionally, in addition to being in the form of particles, the wavelength converting material 300 can also be in the form of gel during manufacturing. Referring to FIG. 5, it is a schematic view of the wavelength converting material in the form of gel according to an embodiment of the present invention. The difference between the wavelength converting material 300' and the wavelength converting material 300 mainly lies in that the wavelength converting material 300' farther includes a transparent material 340 in which the wavelength converting activator 310 and the scatter 320 are distributed.

Furthermore, the wavelength converting activator can further include a core and a first transparent coating besides the fluorescent material, phosphorous material, dyes, and any combination thereof. The relative description will be described in detail below.

Figure 6:
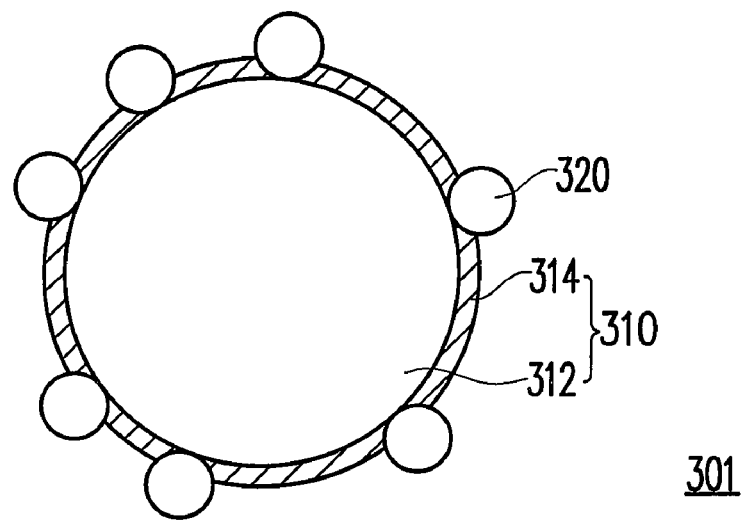
FIG. 6 is a schematic view of the wavelength converting material according to an embodiment of the present invention.

FIG. 6 is a schematic view of the wavelength converting material according to an embodiment of the present invention. Referring to FIG. 6, the wavelength converting material 301 mainly includes the wavelength converting activator 310 and the scatter 320. The difference between the wavelength converting material 301 and the wavelength converting 300 (FIG. 3) lies in that the wavelength converting activator mainly includes a core 312 and a first transparent coating 314. The core 312 is suitable for being activated by the light with the wavelength $\lambda$, so as to emit the light with the wavelength $\lambda_2$, where $\lambda_1 \neq \lambda_2$.

The material of the core 312 is selected from, for example, fluorescent material, phosphorous material, dyes, and any combination thereof. More particularly, the composition of the wavelength converting activator 310 is represented by, for example $(A)_{2x}(B)_{2y}(C)_{2z}(D)_{3x+sy+tz}:(E)$, wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof. The first transparent coating 314 is clad on the core 312, wherein the first transparent coating 314 is, for example, $SiO_2$ or another transparent material. The scatter 320 is physically or chemically bonded with the first transparent coating 314.

Definitely, the wavelength converting material 301 of the present embodiment can further include a transparent material 340 as shown in FIG. 5, such that the wavelength converting material 301 is in the form of gel during manufacturing, which will not be described herein again.

Figure 7:
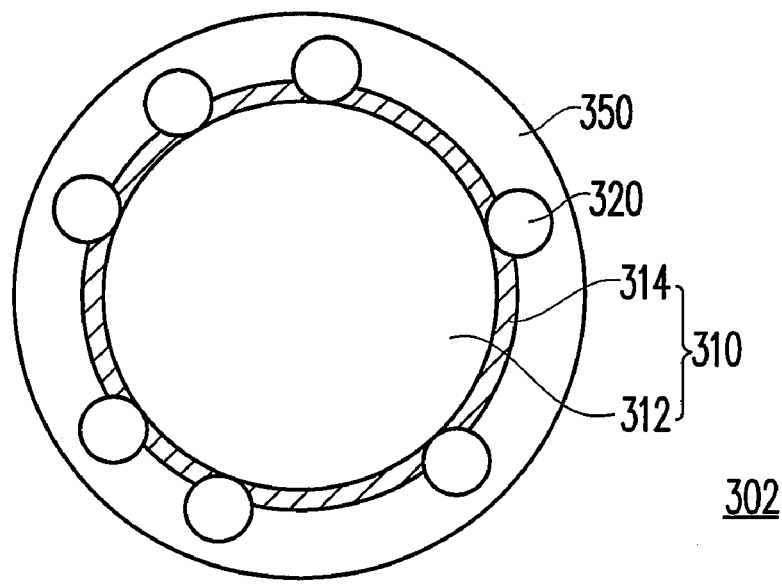
FIG. 7 is a schematic view of the wavelength converting material according to an embodiment of the present invention.

Additionally, in another embodiment of the present invention, the wavelength converting material can include a second transparent coating in addition to the first transparent coating. Referring to FIG. 7, it is a schematic view of the wavelength converting material according to an embodiment of the present invention. The difference between the wavelength converting material 302 and the wavelength converting material 301 (FIG. 6) mainly lies in that the wavelength converting material 302 further includes a second transparent coating 350, wherein the second transparent coating 350 is clad on the wavelength converting activator 310 and the scatters 320. The second transparent coating 350 is, for example, $SiO_2$ or another transparent material.

Of course, the wavelength converting material 302 in the present embodiment can further include a transparent material as shown in FIG. 5, such that the wavelength converting material 302 is in the form of gel during manufacturing, which will not be described herein again.

Based on the above, according to the present invention, the above wavelength converting material (such as the wavelength converting materials 300, 301, and 302) can be further applied in various light-emitting devices such as LEDs, field emission devices (FEDs), or other light-emitting devices. An LED is taken as an example for illustrating in detail below.

Figure 8:
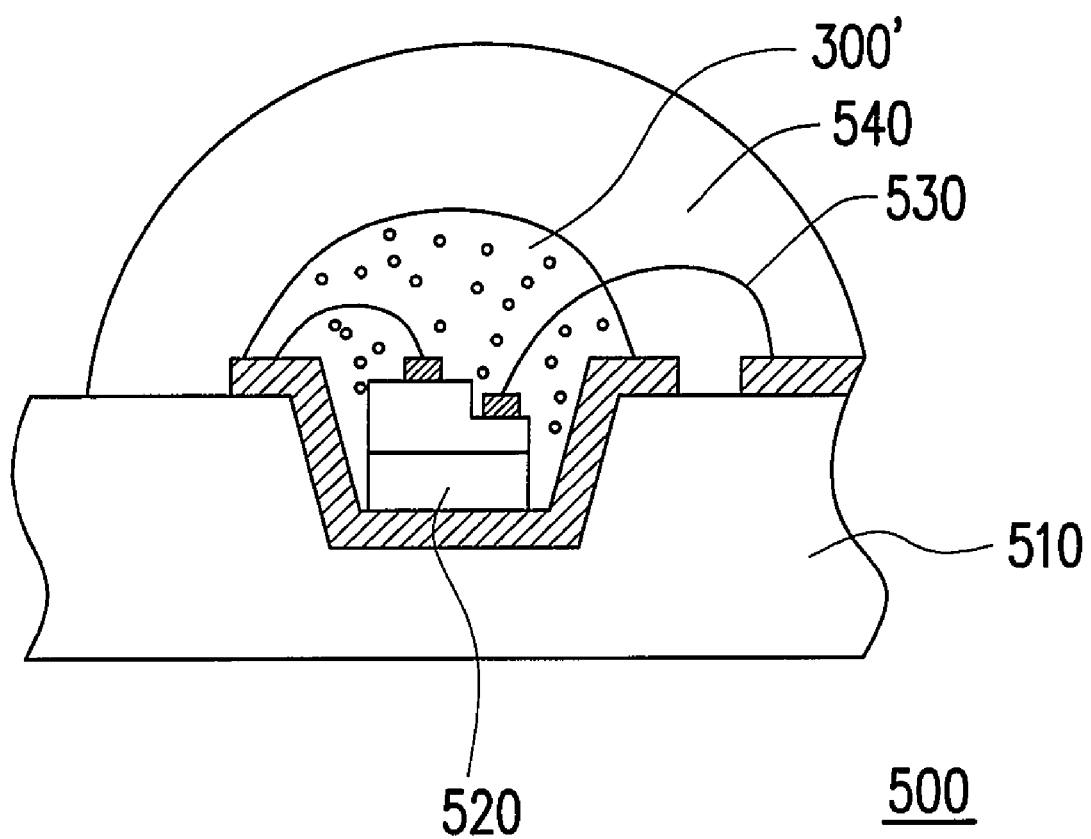
FIG. 8 is a schematic view of the LED according to an embodiment of the present invention.

FIG. 8 is a schematic view of the LED according to an embodiment of the present invention. Referring to FIG. 8, the LED 500 mainly includes a carrier 510, an LED chip 520, and a wavelength converting material 300', wherein the LED chip 520 is, for example, a blue LED chip, an ultraviolet LED chip, a blue-green LED chip, or another LED chip suitable for functioning as the activated light source. The LED chip 520 is disposed on the carrier 510 and electrically connected to the carrier 510 via a bonding wire 530. The LED chip 520 is suitable for emitting the light with the wavelength $\lambda_1$. It should be noted that the present embodiment is not intended to limit the form of the carrier of the present invention and the connection method of the LED chip and the carrier. In another embodiment of the present invention, a carrier in another form such as a lead frame can be employed and the carrier can be electrically connected to the LED chip in another electrical connection method.

The wavelength converting material 300' is disposed around the LED chip 520. Furthermore, the LED 500 in the present invention further includes a molding compound 540 disposed on the carrier 510, so as to seal the LED chip 520 and the wavelength converting material 300' between the carrier 510 and the molding compound 540.

When the LED chip 520 emits the light with the wavelength $\lambda_1$, a part of the light with the wavelength $\lambda_1$ is directly irradiated to the wavelength converting activator 310. The remaining part of the light with the wavelength $\lambda_1$ is irradiated to the scatter 320 and then irradiated to the wavelength converting activator 310 after being scattered by the scatter 320. Then, the wavelength converting activator 310 is activated by the light with the wavelength $\lambda_1$ so as to emit the light with the wavelength $\lambda_2$. As such, after the lights with the two wavelengths are mixed, the LED chip 520 can emit a color light with a specific color. For example, when $\lambda_1$ is in the wavelength range of the blue light and $\lambda_2$ is in the wavelength range of the yellow right, the LED chip 520 can emit white light.

Although the LED 500 with the wavelength converting material 300' is taken as an example, in another embodiment of the present invention, the LED with the wavelength converting material 301 in the form of gel or with the wavelength converting material 302 can also be employed. It should be noted that when the LED employs the wavelength converting material 301 in the form of gel during manufacturing, in the present embodiment, the light refraction index of the transparent material can be adjusted to be approximate to that of the first transparent coating 314, so as to avoid total reflection and Fresnel loss at the junction of the first transparent coating 314 and the transparent material 340 when the light is irradiated into the transparent material 340 from the first transparent coating 314.

In view of the above, the LED and the wavelength converting material provided by the present invention have at least the following advantages.

1. Since the scatters are capable of scattering light irradiated to the surface thereof, the light with the wavelength $\lambda_1$ emitted by the LED and the light with the wavelength $\lambda_2$ emitted by the activated wavelength converting activators can be uniformly mixed.

2. Since the scatters on the wavelength converting activators can increase the gap between two adjacent wavelength converting activators, the wavelength converting activators can be sufficiently activated. Taking FIG. 5 as an example, since the scatter 320 can increase the gap between the wavelength converting activators 310, though the aggregation phenomenon of the wavelength converting activators 310 occurs, an appropriate gap still can be kept between the adjacent wavelength converting activators 310. Therefore, the light L with the wavelength $\lambda_1$ can activate the wavelength converting activator through such gap. That is, compared with the conventional art, the wavelength converting activator provided by the present invention can be sufficiently activated so as to emit the light with the wavelength $\lambda_2$.

3. When the LED has the wavelength converting material, since the wavelength converting activator can be activated more sufficiently, the brightness of the LED provided by the present invention is higher.

It will be apparent to those skilled in the art that various modifications and variations can be made to the structure of the present invention without departing from the scope or spirit of the invention. In view of the foregoing, it is intended that the present invention is overlaid on modifications and variations of this invention provided they fall within the scope of the following claims and their equivalents.

What is claimed is:

1. A wavelength converting material, comprising:
a wavelength converting activator suitable for being activated by a light with a wavelength $\lambda_1$ so as to emit a light with a wavelength $\lambda_2$;
a scatter disposed on the wavelength converting activator, the scatter being suitable for scattering the light irradiated to a surface thereof; and
a bonding compound located between the wavelength converting activator and the scatter, wherein the bonding compound is suitable for being activated by the light with the wavelength $\lambda_1$ so as to emit a light with a wavelength $\lambda_4$.

2. The wavelength converting material as claimed in claim 1, wherein the material of the wavelength converting activator is selected from fluorescent material, phosphorous material, dyes, and any combination thereof.

3. The wavelength converting material as claimed in claim 2, wherein the composition of the wavelength converting activator is represented by: $(A)_{2x}(B)_{2y}(C)_{2z}(D)_{3x+sy+tz}$:(E), wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

4. The wavelength converting material as claimed in claim 1, wherein the material of the scatter is selected from $Al_2O_3$, ZnO, $SiO_2$, $TiO_2$, or the material with the composition of $(A)_{2x'}(B)_{2y'}(C)_{2z'}(D)_{3x'+s'y'+t'z'}$:(E), wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

5. The wavelength converting material as claimed in claim 1, wherein the scatter is suitable for being activated by the light with the wavelength $\lambda_1$ so as to emit a light with a wavelength $\lambda_3$.

6. The wavelength converting material as claimed in claim 1, wherein the scatter is suitable for being activated by the light with the wavelength $\lambda_2$ so as to emit a light with a wavelength $\lambda_3$.

7. The wavelength converting material as claimed in claim 1, further comprising a transparent material, wherein the wavelength converting activator and the scatter are distributed in the transparent material.

8. A wavelength converting material, comprising:
a wavelength converting activator suitable for being activated by a light with a wavelength $\lambda_1$ so as to emit a light with a wavelength $\lambda_2$; and
a scatter disposed on the wavelength converting activator, the scatter being suitable for scattering the light irradiated to a surface thereof, wherein the wavelength converting activator comprises:
  a core suitable for being activated by a light with a wavelength $\lambda_1$ so as to emit a light with a wavelength $\lambda_2$; and
  a first transparent coating cladding the core, wherein the first transparent coating is $SiO_2$.

9. The wavelength converting material as claimed in claim 8, wherein the material of the core is selected from fluorescent material, phosphorous material, dyes, and any combination thereof.

10. The wavelength converting material as claimed in claim 8, wherein the composition of the core is represented by: $(A)_{2x}(B)_{2y}(C)_{2z}(D)_{3x+sy+tz}$:(E), wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof and E is selected from Ce, Eu, Tb, Mn, and any combination thereof.

11. The wavelength converting material as claimed in claim 8, wherein the material of the scatter is selected from $Al_2O_3$, ZnO, $SiO_2$, $TiO_2$, or the material with the composition of $(A)_{2x'}(B)_{2y'}(C)_{2z'}(D)_{3x'+s'y'+t'z'}$:(E), wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

12. The wavelength converting material as claimed in claim 8, wherein the scatter is suitable for being activated by the light with the wavelength $\lambda_2$ so as to emit a light with a wavelength $\lambda_3$.

13. The wavelength converting material as claimed in claim 8, wherein the scatter is suitable for being activated by the light with the wavelength $\lambda_2$ so as to emit a light with a wavelength $\lambda_3$.

14. The wavelength converting material as claimed in claim 8, further comprising a transparent material, wherein the wavelength converting activator and the scatter are distributed in the transparent material.

15. A wavelength converting material, comprising:
a wavelength converting activator suitable for being activated by a light with a wavelength $\lambda_1$ so as to emit a light with a wavelength $\lambda_2$;
a scatter disposed on the wavelength converting activator, the scatter being suitable for scattering the light irradiated to a surface thereof; and
a second transparent coating cladding the wavelength converting activator and the scatter, wherein the second transparent coating is $SiO_2$.

16. The wavelength converting material as claimed in claim 15, wherein the material of the wavelength converting activator is selected from fluorescent material, phosphorous material, dyes, and any combination thereof.

17. The wavelength converting material as claimed in claim 16, wherein the composition of the wavelength converting activator is represented by: $(A)_{2x}(B)_{2y}(C)_{2z}(D)_{3x+sy+tz}$:(E), wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

18. The wavelength converting material as claimed in claim 15, wherein the material of the scatter is selected from $Al_2O_3$, ZnO, $SiO_2$, $TiO_2$, or the material with the composition of $(A)_{2x'}(B)_{2y'}(C)_{2z'}(D)_{3x'+s'y'+t'z'}$:(E), wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

19. The wavelength converting material as claimed in claim 15, wherein the scatter is suitable for being activated by the light with the wavelength $\lambda_1$ so as to emit a light with a wavelength $\lambda_3$.

20. The wavelength converting material as claimed in claim 15, wherein the scatter is suitable for being activated by the light with the wavelength $\lambda_2$ so as to emit a light with a wavelength $\lambda_3$.

21. The wavelength converting material as claimed in claim 15, further comprising a transparent material, wherein the wavelength converting activator and the scatter are distributed in the transparent material.

22. A light emitting diode (LED), comprising:
a carrier;
an LED chip disposed on the carrier and being electrically connected to the carrier, the LED chip being suitable for emitting a light with a wavelength $\lambda_1$; and
a wavelength converting material disposed around the LED chip, wherein the wavelength converting material comprises:
a wavelength converting activator suitable for being activated by the light with the wavelength $\lambda_1$ so as to emit a light with a wavelength $\lambda_2$;
a scatter, disposed on the wavelength converting activator and suitable for scattering the light irradiated to a surface thereof; and
a bonding compound located between the wavelength converting activator and the scatter.

23. The LED as claimed in claim 22, wherein the material of the wavelength converting activator is selected from fluorescent material, phosphorous material, dyes, and any combination thereof.

24. The LED as claimed in claim 23, wherein the composition of the wavelength converting activator is represented by: $(A)_{2x}(B)_{2y}(C)_{2z}(D)_{3x+sy+tz}$:(E), wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

25. The LED as claimed in claim 22, wherein the material of the scatter is selected from $Al_2O_3$, ZnO, $SiO_2$, $TiO_2$, or the material with the composition of $(A)_{2x'}(B)_{2y'}(C)_{2z'}(D)_{3x'+s'y'+t'z'}$:(E), wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

26. The LED as claimed in claim 22, wherein the scatter is suitable for being activated by the light with the wavelength $\lambda_1$ so as to emit a light with a wavelength $\lambda_3$.

27. The LED as claimed in claim 22, wherein the scatter is suitable for being activated by the light with the wavelength $\lambda_2$ so as to emit a light with a wavelength $\lambda_3$.

28. The LED as claimed in claim 22, wherein the bonding compound is suitable for being activated by the light with the wavelength $\lambda_1$ so as to emit a light with a wavelength $\lambda_4$.

29. The LED as claimed in claim 22, wherein the wavelength converting material further comprises a transparent material, and the wavelength converting activator and the scatter are distributed in the transparent material.

30. The LED as claimed in claim 29, wherein the wavelength converting activator comprises:
a core suitable for being activated by a light with a wavelength $\lambda_1$ so as to emit a light with a wavelength $\lambda_2$; and
a first transparent coating cladding the core, wherein the light refractive index of the transparent material is approximate to that of the first transparent coating, so as to avoid a total reflection and Fresnel loss at the junction of the first transparent coating and the transparent material when the light is irradiated into the transparent material from the first transparent coating.

31. A light emitting diode (LED), comprising:
a carrier;
an LED chip disposed on the carrier and being electrically connected to the carrier, the LED chip being suitable for emitting a light with a wavelength $\lambda_1$; and
a wavelength converting material disposed around the LED chip, wherein the wavelength converting material comprises:
a wavelength converting activator suitable for being activated by the light with the wavelength $\lambda_1$ so as to emit a light with a wavelength $\lambda_2$;
a scatter, disposed on the wavelength converting activator and suitable for scattering the light irradiated to a surface thereof; and
a bonding compound located between the wavelength converting activator and the scatter, wherein the wavelength converting activator comprises:
a core suitable for being activated by a light with a wavelength $\lambda_1$ so as to emit a light with a wavelength $\lambda_2$; and
a first transparent coating cladding the core.

32. The LED as claimed in claim 31, wherein the material of the core is selected from fluorescent material, phosphorous material, dyes, and any combination thereof.

33. The LED as claimed in claim 31, wherein the composition of the core is represented by: $(A)_{2x}(B)_{2y}(C)_{2z}(D)_{3x+sy+tz}$:(E), wherein $0 \leq x \leq 15$, $0 \leq y \leq 9$, $0 \leq z \leq 4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

34. The LED as claimed in claim 31, wherein the first transparent coating is $SiO_2$.

35. The LED as claimed in claim 31, wherein the material of the scatter is selected from $Al_2O_3$, ZnO, $SiO_2$, $TiO_2$, or the material with the composition of $(A)_{2x'}(B)_{2y'}(C)_{2z'}(D)_{3x'+s'y'+t'z'}$:(E), wherein $0 \leq x' \leq 15$, $0 \leq y' \leq 9$, $0 \leq z' \leq 4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

36. The LED as claimed in claim 31, wherein the scatter is suitable for being activated by the light with the wavelength $\lambda_1$ so as to emit a light with a wavelength $\lambda_3$.

37. The LED as claimed in claim 31, wherein the scatter is suitable for being activated by the light with the wavelength $\lambda_2$ so as to emit a light with a wavelength $\lambda_3$.

38. The LED as claimed in claim 31, wherein the bonding compound is suitable for being activated by the light with the wavelength $\lambda_1$ so as to emit a light with a wavelength $\lambda_4$.

39. The LED as claimed in claim 31, wherein the wavelength converting material further comprises a transparent material, and the wavelength converting activator and the scatter are distributed in the transparent material.

40. A light emitting diode (LED), comprising:
a carrier;
an LED chip disposed on the carrier and being electrically connected to the carrier, the LED chip being suitable for emitting a light with a wavelength $\lambda_1$; and
a wavelength converting material disposed around the LED chip, wherein the wavelength converting material comprises:
a wavelength converting activator suitable for being activated by the light with the wavelength $\lambda_1$ so as to emit a light with a wavelength $\lambda_2$;
a scatter, disposed on the wavelength converting activator and suitable for scattering the light irradiated to a surface thereof;
a bonding compound located between the wavelength converting activator and the scatter; and
a second transparent coating cladding the wavelength converting activator and the scatter.

41. The LED as claimed in claim 40, wherein the second transparent coating is $SiO_2$.

42. The LED as claimed in claim 40, wherein the material of the wavelength converting activator is selected from fluorescent material, phosphorous material, dyes, and any combination thereof.

43. The LED as claimed in claim 42, wherein the composition of the wavelength converting activator is represented by: $(A)_{2x}(B)_{2y}(C)_{2z}(D)_{3x+sy+tz}:(E)$, wherein $0\leq x\leq15$, $0\leq y\leq9$, $0\leq z\leq4$; s is the valence number of Component B; t is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

44. The LED as claimed in claim 40, wherein the material of the scatter is selected from $Al_2O_3$, ZnO, $SiO_2$, $TiO_2$, or the material with the composition of $(A)_{2x'}(B)_{2y'}(C)_{2z'}(D)_{3x'+s'y'+t'z'}:(E)$, wherein $0\leq x'\leq15$, $0\leq y'\leq9$, $0\leq z'\leq4$; s' is the valence number of Component B; t' is the valence number of Component C; and A is selected from Y, Ce, Tb, Gd, Sc, Sm, Eu, Al, Ga, Tl, In, B, Lu, and any combination thereof; B is selected from Mg, Ca, Sr, Ba, Zn, Cu, Ni, Li, Na, K, Ag, and any combination thereof; C is selected from Mo, W, P, V, Si, Ti, Zr, Nb, Ta, and any combination thereof; D is selected from O, S, Se, and any combination thereof; and E is selected from Ce, Eu, Tb, Mn, and any combination thereof.

45. The LED as claimed in claim 40, wherein the scatter is suitable for being activated by the light with the wavelength $\lambda_2$ so as to emit a light with a wavelength $\lambda_3$.

46. The LED as claimed in claim 40, wherein the scatter is suitable for being activated by the light with the wavelength $\lambda_2$ so as to emit a light with a wavelength $\lambda_3$.

47. The LED as claimed in claim 40, wherein the bonding compound is suitable for being activated by the light with the wavelength $\lambda_1$ so as to emit a light with a wavelength $\lambda_4$.

48. The LED as claimed in claim 40, wherein the wavelength converting material further comprises a transparent material, and the wavelength converting activator and the scatter are distributed in the transparent material.

49. The LED as claimed in claim 48, wherein the wavelength converting activator comprises:
a core suitable for being activated by a light with a wavelength $\lambda_1$ so as to emit a light with a wavelength $\lambda_2$; and
a first transparent coating cladding the core, wherein the light refractive index of the transparent material is approximate to that of the first transparent coating, so as to avoid a total reflection and Fresnel loss at the junction of the first transparent coating and the transparent material when the light is irradiated into the transparent material from the first transparent coating.

* * * * *